United States Patent
Chen

(10) Patent No.: US 7,997,752 B2
(45) Date of Patent: Aug. 16, 2011

(54) LIGHTING DEVICE AND POWER SUPPLY SYSTEM FOR THE LIGHTING DEVICE

(75) Inventor: Ga-Lane Chen, Santa Clara, CA (US)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 416 days.

(21) Appl. No.: 12/276,575

(22) Filed: Nov. 24, 2008

(65) Prior Publication Data

US 2009/0268439 A1  Oct. 29, 2009

(30) Foreign Application Priority Data

Apr. 28, 2008 (CN) .......................... 2008 1 0301344

(51) Int. Cl.
F21L 13/00 (2006.01)
(52) U.S. Cl. ........................................ 362/183; 362/268
(58) Field of Classification Search .................. 362/183, 362/268, 800
See application file for complete search history.

(56) References Cited

U.S. PATENT DOCUMENTS

| | | | |
|---|---|---|---|
| 6,950,238 B2 * | 9/2005 | Tsai et al. ...................... | 362/619 |
| 2003/0137831 A1 * | 7/2003 | Lin ................................ | 362/183 |
| 2007/0091594 A1 * | 4/2007 | Soon .............................. | 362/183 |
| 2007/0235071 A1 * | 10/2007 | Work et al. .................... | 136/244 |
| 2008/0272278 A1 * | 11/2008 | Shewa et al. .................. | 362/183 |

* cited by examiner

Primary Examiner — Y My Quach Lee
(74) Attorney, Agent, or Firm — Andrew C. Cheng

(57) ABSTRACT

A lighting device includes a light collecting unit, a solar cell panel, a storage battery, a lighting element and a control unit. The light collecting unit includes a lens exposed to outside light, and an optical leveling element. The optical leveling element includes a light guide plate having a dot pattern arranged thereon and facing toward the lens module. A refractive index of the dot pattern gradually increases from a center to a periphery. The solar cell panel is aligned with the optical leveling element, and is configured for receiving light transmitted through the optical leveling element and converting the light into electrical energy. The control unit is connected to the solar cell panel and the storage battery, and is configured for controlling the solar cell panel to power the storage battery and controlling the storage battery to power the lighting element.

10 Claims, 3 Drawing Sheets

LIGHTING DEVICE AND POWER SUPPLY SYSTEM FOR THE LIGHTING DEVICE

BACKGROUND

1. Technical Field

The present invention relates to lighting devices, and a power supply system for a lighting device.

2. Description of Related Art

Currently, various solar cell panels are designed to receive and convert sunlight energy into electrical energy, thereby powering various electronic devices, such as lighting devices. Such solar cell panels have been applied on roofs of buildings and cars, and on surfaces of portable electronic devices.

A typical solar cell panel includes a P-type semiconductor layer and an N-type semiconductor layer. When sunlight falls on a surface of the P-type semiconductor layer or on a surface of the N-type semiconductor layer, a part of the sunlight is unavoidably reflected by the surface, and the remainder is absorbed by the corresponding P-type semiconductor layer or N-type semiconductor layer. Photons in the absorbed sunlight collide with electrons in the corresponding P-type semiconductor layer or N-type semiconductor layer. Thereby, electron-hole pairs are generated, and thus an electric field is formed between the P-type semiconductor layer and the N-type semiconductor layer. In this way, the solar cell converts the sunlight energy into electrical power.

The solar energy that the solar cell panel receives is limited by the surface area exposed to sunlight. Buildings, cars and portable electronic devices have finite outside surface areas. Accordingly, a large surface area for laying out a large solar cell panel or a plurality of solar cell panels may be unavailable.

What are needed, therefore, are a power supply system and a lighting device using the power supply system, which can overcome the above shortcomings.

SUMMARY

A lighting device includes a light collecting unit, a solar cell panel, a storage battery, a lighting element and a control unit. The light collecting unit includes a lens exposed to outside light and an optical leveling element. The optical leveling element includes a light guide plate having a dot pattern. The dot pattern faces toward the lens. A refractive index of the dot pattern gradually increases from a center of the dot pattern to a periphery of the dot pattern. The solar cell panel is aligned with the optical leveling element, configured for receiving light transmitted through the optical leveling element and converting the light into an electrical energy. The lighting element is electrically connected to the storage battery. The control unit is connected to the solar cell panel and the storage battery, configured for controlling the solar cell panel to power the storage battery and controlling the storage battery to power the lighting element.

Other advantages and novel features will become more apparent from the following detailed description of embodiments when taken in conjunction with the accompanying drawings.

BRIEF DESCRIPTION OF THE DRAWINGS

Many aspects of the present lighting device and power supply system can be better understood with reference to the following drawings. The components in the drawings are not necessarily drawn to scale, the emphasis instead being placed upon clearly illustrating the principles of the present lighting device and power supply system. Moreover, in the drawings, like reference numerals designate corresponding parts throughout the several views.

DETAILED DESCRIPTION OF EMBODIMENTS

Embodiments of the present lighting device and power supply system will now be described in detail below and with reference to the drawings.

Figure 1:
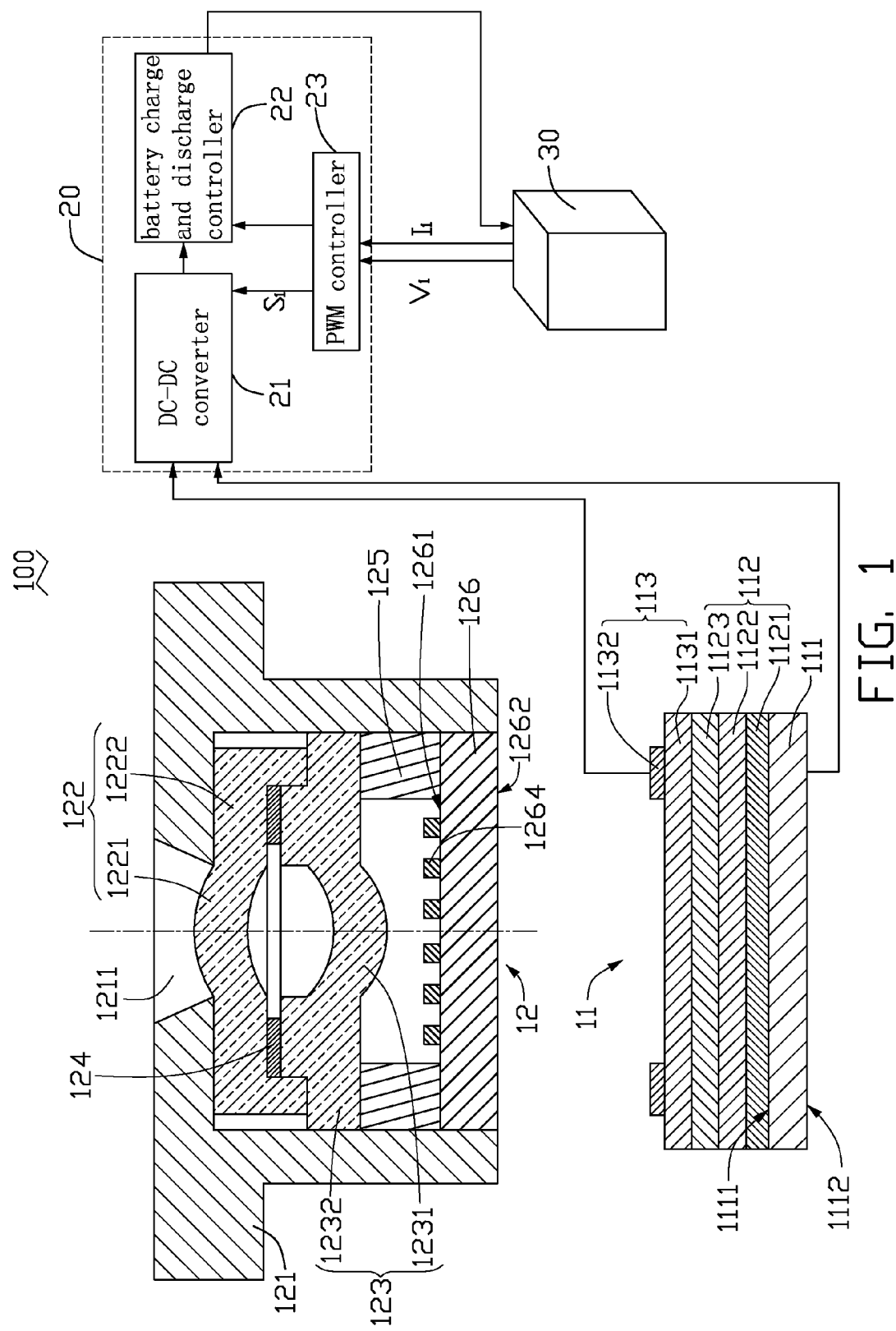
FIG. 1 is a schematic and cross-sectional view of a power supply system in accordance with an exemplary embodiment, the power supply system including an optical leveling element.
Figure 2:
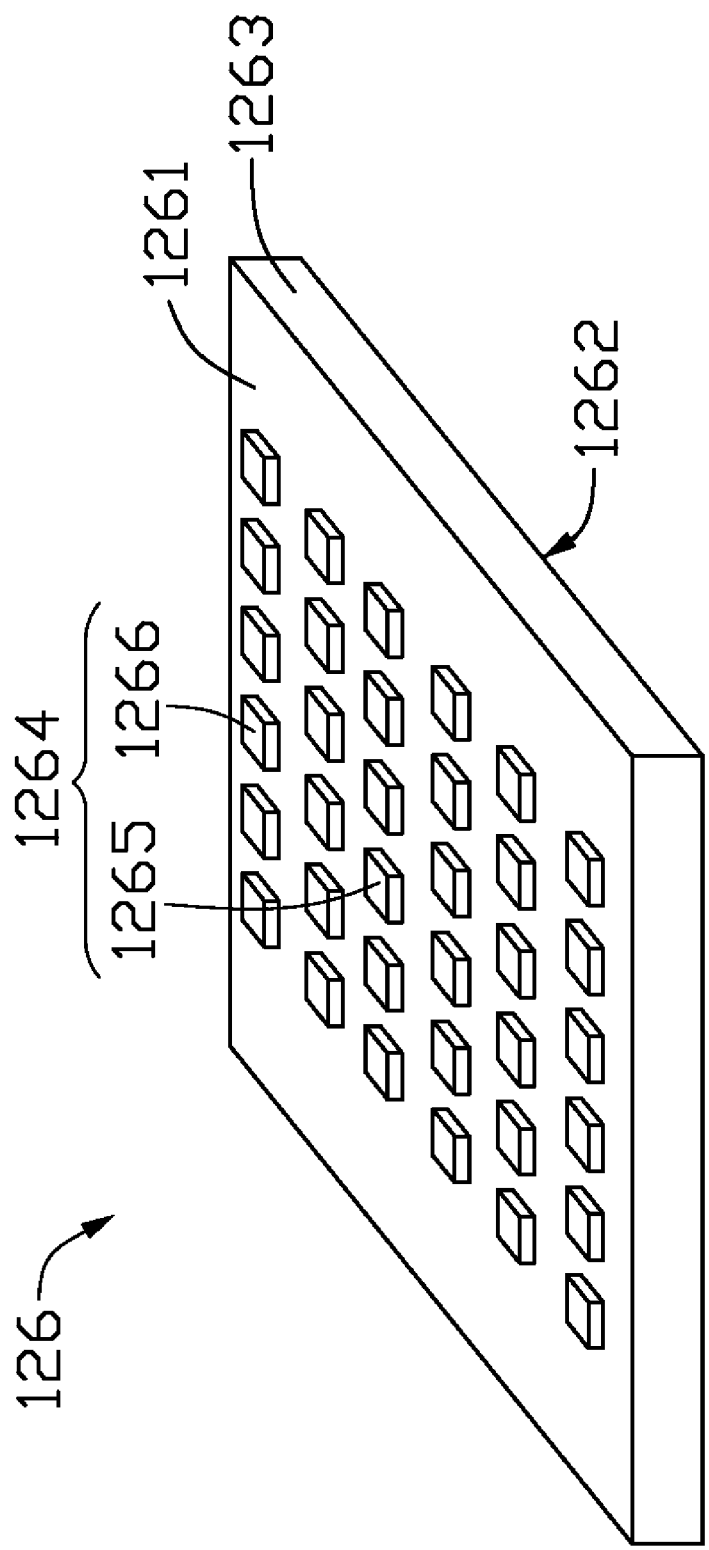
FIG. 2 is an isometric view of the optical leveling element shown in FIG. 1.
Figure 3:
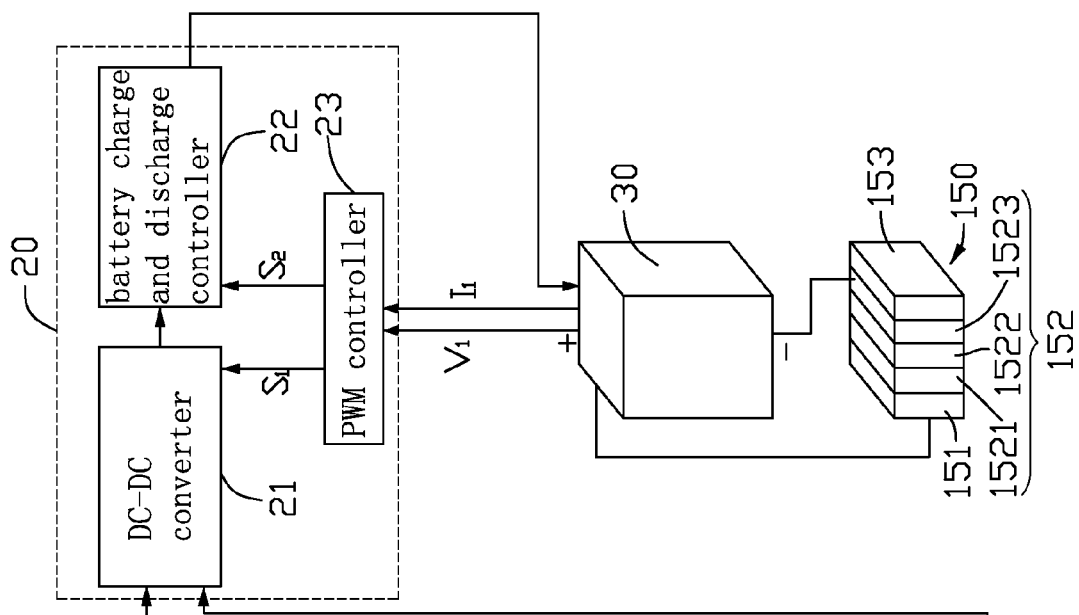
FIG. 3 is a schematic and cross-sectional view of a lighting device in accordance with an exemplary embodiment.
Figure 3:
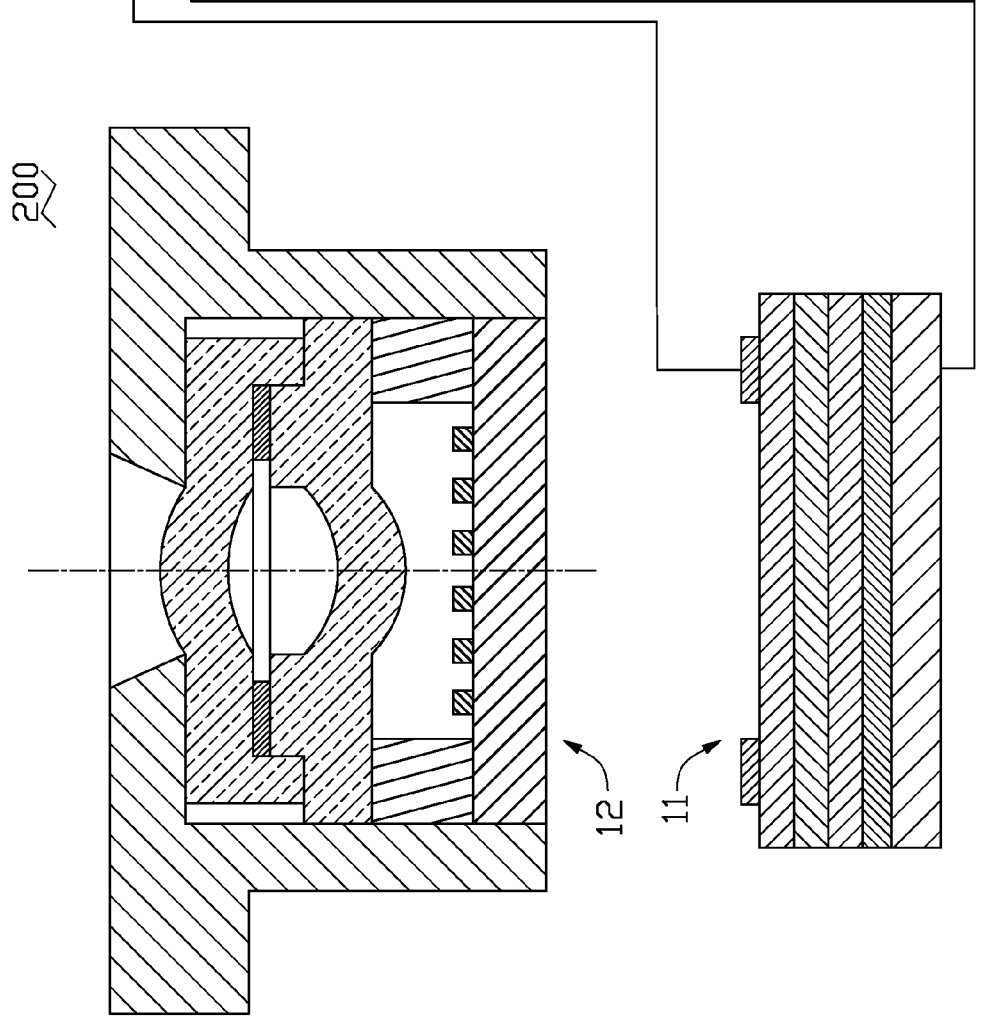

Referring to FIGS. 1 to 3, an exemplary power supply system 100 and a lighting device 200 in accordance with exemplary embodiments, are shown. The power supply system 100 includes a light collecting unit 12, a solar cell panel 11, a control unit 20, and a storage battery 30. A lighting element 150 of the lighting device 200 is electrically connected to the storage battery 30.

The light collecting unit 12 includes a lens barrel 121, a first lens 122, a second lens 123, a first spacer 124 sandwiched between the first lens 122 and the second lens 123, an optical leveling element 126, and a second spacer 125 sandwiched between the second lens 123 and the optical leveling element 126.

The lens barrel 121 has a light incident opening 1211 defined at a first end thereof. The first lens 122 and the second lens 123 each have a central optical portion 1221, 1231, and a peripheral portion 1222, 1232, respectively. The central optical portion 1221 of the first lens 122 is aligned with the light incident opening 1211 so as to be exposed to outside light. The first lens 122 and the second lens 123 each may be selected from a convex lens and a concave lens. In the present embodiment, each of the first lens 122 and the second lens 123 is essentially a convex lens. Due to the shapes of the first and second lenses 122, 123, the intensity of light transmitted through the centers of the central optical portions 1221, 1231 of the first and second lenses 122, 123 is different from that of the peripheries of the central optical portions 1221, 1231 of the first and second lenses 122, 123, respectively. In particular, the light intensity of the centers of the central optical portions 1221, 1231 of the first and second lenses 122, 123 is larger than that of the peripheries of the central optical portions 1221, 1231 of the first and second lenses 122, 123, respectively.

The optical leveling element 126 is received in an opposite second end of the lens barrel 121. The optical leveling element 126 includes a light guide plate 1263 having a dot pattern 1264. The light guide plate 1263 includes a first surface 1261 and a second surface 1262 at opposite sides thereof. The first surface 1261 faces the second lens 123. The dot pattern 1264 is arranged on the first surface 1261 of the optical leveling element 126. The dot pattern 1264 includes a plurality of lower refractive index dots 1265 arranged in a center of the first surface 1261 and a plurality of higher refractive index dots 1266 arranged around the lower refractive index dots 1265. In the present embodiment, the lower and higher refractive index dots 1265, 1266 are in the form of protrusions on the first surface 1261. The lower and higher refractive index dots 1265, 1266 are formed on the first surface 1261 by way of, for example, a printing process. In other embodiments, the lower and higher refractive index dots 1265, 1266 can be protrusions that are integrally formed with the light guide plate 1263. In such case, the lower and higher refractive index dots 1265, 1266 and the light guide plate 1263 are portions of a single body of material that can be formed by, for example, a molding process. In other alternative embodiments, the lower and higher refractive index dots 1265, 1266 may be in the form of recesses in the first surface 1261. In the present embodiment, a refractive index of the dot pattern 1264 gradually increases from a center thereof to a periphery thereof. In this way, the optical leveling element 126 can level the light transmitted through the first lens 122 and the second lens 123. That is, the intensity of light transmitted through the center of the light guide plate 1263 of the optical leveling element 126 where the lower refractive index dots 1265 are arranged thereon, can be substantially the same as the intensity of light transmitted through a periphery of the center of the light guide plate 1263 of the optical leveling element 126 where the higher refractive index dots 1266 are arranged thereon.

The solar cell panel 11 includes a back metal electrode 111, a semiconductor layer 112, and a front contact layer 113. The back metal electrode 111 has a first surface 1111 and a second surface 1112 at opposite sides thereof. The semiconductor layer 112 is formed on the first surface 1111 of the back metal electrode 111, and includes a P-type semiconductor layer 1121, an N-type semiconductor layer 1123 and a P-N junction layer 1122. The front contact layer 113 includes a transparent electrically conductive layer 1131 and a pair of front metal electrodes 1132. Due to the configuration of the light collecting unit 12, the solar cell panel 11 need not necessarily be exposed to the outside. The solar cell panel 11 can receive the light transmitted through the optical leveling element 126 with substantially the same intensity.

The storage battery 30 is electrically connected to the solar cell panel 11 via the control unit 20. The control unit 20 includes a direct current to direct current (DC-DC) converter 21, a battery charge and discharge controller 22, and a pulse width modulation (PWM) controller 23. The DC-DC converter 21 is connected to the second surface 1112 of the back metal electrode 111 and to the front metal electrode 1132 of the solar cell panel 11, and is configured for converting a direct current generated by the solar cell panel 11 into a direct current which the storage battery 30 can receive. The battery charge and discharge controller 22 is connected to the DC-DC converter 21 and the storage battery 30. The pulse width modulation controller 23 is connected to the DC-DC converter 21, the battery charge and discharge controller 22 and the storage battery 30.

The lighting element 150 may be a light emitting diode (LED). The lighting element 150 includes a metal contact layer 151, a semiconductor layer 152, and a transparent cover 153. The metal contact layer 151 is electrically connected to an anode of the storage battery 30. The semiconductor layer 152 includes a P-type semiconductor layer 1521, an N-type semiconductor layer 1523, and a P-N junction layer 1522. The N-type semiconductor layer 1523 is electrically connected to a cathode of the storage battery 30.

In a battery charge operation for the storage battery 30, the PWM controller 23 first obtains a voltage signal $V_1$ and a current signal $I_1$ of the storage battery 30, and then outputs a charge signal $S_1$ to activate the DC-DC converter 21 to work in a charging mode, whereupon the battery charge and discharge controller 22 is activated to perform the battery charge operation. The DC-DC converter 21 can then output a direct current to the storage battery 30 via the battery charge and discharge controller 22.

In operation of the lighting element 150, the first PWM controller 23 outputs a discharge signal $S_2$ to the battery charge and discharge controller 22, and the battery charge and discharge controller 22 then switches to a battery discharge operation. The battery charge and discharge controller 22 thereupon controls the storage battery 30 to power the lighting element 150.

It is understood that the above-described embodiments are intended to illustrate rather than limit the invention. Variations may be made to the embodiments without departing from the spirit of the invention. Accordingly, it is appropriate that the appended claims be construed broadly and in a manner consistent with the scope of the invention.

What is claimed is:

1. A lighting device, comprising:
a light collecting unit comprising a lens barrel with a light incident opening defined at a first end thereof, a lens having a central portion and a peripheral portion, and an optical leveling element, the lens received in the lens barrel with the central optical portion aligned with the light incident opening, the optical leveling element received at a second end of the lens barrel and comprising a light guide plate having a dot pattern, the dot pattern facing toward the lens, a refractive index of the dot pattern gradually increasing from a center of the dot pattern to a periphery of the dot pattern;
a solar cell panel aligned with the optical leveling element, and configured for receiving light transmitted through the optical leveling element and converting the light into electrical energy;
a storage battery;
a lighting element electrically connected to the storage battery; and
a control unit connected to the solar cell panel and the storage battery, and configured for controlling the solar cell panel to power the storage battery and controlling the storage battery to power the lighting element.

2. The lighting device as described in claim 1, wherein the central optical portion of the lens is one of convex shaped and concave shaped.

3. The lighting device as described in claim 1, wherein the dot pattern comprises a plurality of lower refractive index dots arranged in a center of the light guide plate and a plurality of higher refractive index dots arranged around the lower refractive index dots.

4. The lighting device as described in claim 1, wherein the control unit comprises a DC-DC converter connected to the solar cell panel, a battery charge and discharge controller connected to the DC-DC converter and the storage battery, and a pulse width modulation controller connected to the DC-DC converter, the battery charge and discharge controller and the storage battery.

5. A power supply system, comprising:
a light collecting unit comprising a lens barrel with a light incident opening defined at a first end thereof, a lens having a central portion and a peripheral portion, and an optical leveling element, the lens received in the lens barrel with the central optical portion aligned with the light incident opening, the optical leveling element received at a second end of the lens barrel and comprising a light guide plate having a dot pattern, the dot pattern facing toward the lens, a refractive index of the dot pattern gradually increasing from a center of the dot pattern to a periphery of the dot pattern;

a solar cell panel aligned with the optical leveling element, and configured for receiving light transmitted through the optical leveling element and converting the light into electrical energy;

a storage battery; and a control unit connected to the solar cell panel and the storage battery, and configured for controlling the solar cell panel to power the storage battery.

6. The power supply system as described in claim 5, wherein the central optical portion of the lens is one of convex shaped and concave shaped.

7. The power supply system as described in claim 5, wherein the dot pattern comprises a plurality of lower refractive index dots arranged in a center of the light guide plate and a plurality of higher refractive index dots arranged around the lower refractive index dots.

8. The power supply system as described in claim 5, wherein the control unit comprises a DC-DC converter connected to the solar cell panel, a battery charge and discharge controller connected to the DC-DC converter and the storage battery, and a pulse width modulation controller connected to the DC-DC converter, the battery charge and discharge controller and the storage battery.

9. A power supply system, comprising:

a light collecting unit comprising a lens barrel with a light incident opening defined at a first end thereof, a lens having a central portion and a peripheral portion, and an optical leveling element, the lens received in the lens barrel with the central optical portion aligned with the light incident opening, the optical leveling element received at a second end of the lens barrel and structured and arranged to convert light of different intensities received from the lens into output light of substantially the same intensity;

a solar cell panel aligned with the optical leveling element, and configured for receiving the light output from the optical leveling element and converting the light into electrical energy;

a storage battery; and a control unit connected to the solar cell panel and the storage battery, and configured for controlling the solar cell panel to power the storage battery.

10. The power supply system as described in claim 9, wherein the optical leveling element comprises a light guide plate having a dot pattern, the dot pattern facing toward the lens, a refractive index of the dot pattern gradually increasing from a center of the dot pattern to a periphery of the dot pattern.

* * * * *